(12) United States Patent
Ueno et al.

(10) Patent No.: US 8,815,986 B2
(45) Date of Patent: Aug. 26, 2014

(54) METHOD FOR STORING RESIN SOLUTION, AND METHOD FOR PRODUCING PREPREG AND LAMINATE

(75) Inventors: Masayoshi Ueno, Tokyo (JP); Yoshihiro Kato, Tokyo (JP); Takeshi Nobukuni, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 186 days.

(21) Appl. No.: 13/258,113

(22) PCT Filed: Mar. 24, 2010

(86) PCT No.: PCT/JP2010/002088
§ 371 (c)(1),
(2), (4) Date: Sep. 21, 2011

(87) PCT Pub. No.: WO2010/109861
PCT Pub. Date: Sep. 30, 2010

(65) Prior Publication Data
US 2012/0018072 A1    Jan. 26, 2012

(30) Foreign Application Priority Data

Mar. 27, 2009   (JP) ................................. 2009-078929

(51) Int. Cl.
| | | |
|---|---|---|
| C08K 5/34 | (2006.01) | |
| C08L 87/00 | (2006.01) | |
| C08J 5/24 | (2006.01) | |
| C09D 163/00 | (2006.01) | |
| C08K 5/3415 | (2006.01) | |
| C08K 3/36 | (2006.01) | |

(52) U.S. Cl.
CPC ................. *C08J 5/24* (2013.01); *C08K 5/3415* (2013.01); *C08K 3/36* (2013.01); *C08J 2379/00* (2013.01); *C09D 163/00* (2013.01)
USPC .......................................... 524/104; 524/589

(58) Field of Classification Search
USPC .................................... 524/104, 589
See application file for complete search history.

(56) References Cited

U.S. PATENT DOCUMENTS

| | | | |
|---|---|---|---|
| 4,110,364 A | | 8/1978 | Gaku et al. |
| 2005/0182203 A1* | | 8/2005 | Sugano et al. ................. 525/423 |
| 2009/0017316 A1* | | 1/2009 | Kato et al. ..................... 428/447 |
| 2009/0117316 A1 | | 5/2009 | Kato et al. |

FOREIGN PATENT DOCUMENTS

| | | |
|---|---|---|
| EP | 2090612 | 8/2009 |
| JP | 50-129700 | 10/1975 |
| JP | 55-073549 | 6/1980 |
| JP | 56-045948 | 4/1981 |
| JP | 08-048001 | 2/1996 |
| JP | 11-124433 | 5/1999 |
| JP | 2000-158589 | 6/2000 |
| JP | 3173332 | 6/2001 |
| JP | 2003-246849 | 9/2003 |
| JP | 2006-143973 | 6/2006 |
| JP | 2007-045984 | 2/2007 |
| JP | 2007-204697 | 8/2007 |
| JP | 2007204697 A * | 8/2007 |
| JP | 2009-013254 | 1/2009 |
| JP | 2009-024056 | 2/2009 |
| JP | 2009-035728 | 2/2009 |

OTHER PUBLICATIONS

Chinese Office Action of Chinese app. No. 201080020904.0 dated Jul. 3, 2013 along w/ English Translation.
Chinese Office Action issued with respect to counterpart Chinese Office Application No. 201080020904.0, dated Oct. 25, 2012 with English translation thereof.
U.S. Appl. No. 13/202,829 to Masayoshi Ueno et al., filed Aug. 23, 2011.
Search Report for International Application No. PCT/JP2010/002088, dated Jun. 15, 2010.
Chinese Office Action for Chinese Patent App. No. 201080020904.0, mailed Feb. 21, 2014, along with an English language translation.
Chinese Office Action, dated Jun. 6, 2014, in corresponding Chinese Patent Application No. 201080020904.0, along with an English translation thereof.
Japanese Office Action, dated May 20, 2014, in corresponding Japanese Patent Application 2011-505870, along with an English translation thereof.
Extended Search Report from E.P.O. in EP 10755663.1, mail date is Jun. 25, 2014.

* cited by examiner

*Primary Examiner* — Kriellion Sanders
(74) *Attorney, Agent, or Firm* — Greenblum & Bernstein, P.L.C.

(57) ABSTRACT

This invention relates to a method for storing a naphthol aralkyl type cyanate ester resin solution, which is difficult to precipitate due to long term storage in a solution state, and particularly relates to a method for storing a naphthol aralkyl type cyanate ester resin solution (AB), which comprises: preparing (i) a naphthol aralkyl type cyanate ester resin solution (AB) comprising a naphthol aralkyl type cyanate ester resin (A), a maleimide compound (B) and a solvent, (ii) a naphthol aralkyl type cyanate ester resin solution (AB) comprising a prepolymer of a naphthol aralkyl type cyanate ester resin (A), a maleimide compound (B) and a solvent, or (iii) a naphthol aralkyl type cyanate ester resin solution (AB) comprising a prepolymer of a naphthol aralkyl type cyanate ester resin (A) and a maleimide compound (B), and a solvent; and storing the resin solution (AB).

3 Claims, No Drawings

METHOD FOR STORING RESIN SOLUTION, AND METHOD FOR PRODUCING PREPREG AND LAMINATE

TECHNICAL FIELD

This invention relates to a method for storing a solution of a raw resin used for an electrical printed wiring board, and methods for producing a prepreg for a printed wiring board, and a laminate and a metal foil clad laminate using the prepreg.

BACKGROUND ART

Conventionally, as a laminate for a printed wiring board, an FR-4 type laminate obtained by curing an epoxy resin with dicyandiamide has been widely used. However, this method had a limitation in response to the demand for high heat resistance. Also, a cyanate ester resin is known as a resin for a printed wiring board with excellent heat resistance, and a prepreg using a resin composition of a bisphenol A type cyanate ester resin and other thermosetting resins or thermoplastic resins has been widely used for a laminate for a semiconductor plastic package in recent years.

Moreover, high integration, high function and high density implementation of semiconductors widely used for electronic devices, communication instruments, personal computers and the like have recently been increasingly accelerated, and the form of a semiconductor plastic package is getting to be diverse as seen in development from QFP to the area implementation type such as BGA and CSP, and additionally appearance of the high function type such as MCP and SIP. Therefore, the demand for high reliability of a laminate for a semiconductor plastic package has increased more than ever.

A semiconductor element has a coefficient of thermal expansion of 3 to 6 ppm/° C., which is smaller than the coefficient of thermal expansion of a typical printed wiring board for a semiconductor plastic package. Therefore, when a thermal shock is added to a semiconductor plastic package, warpage is generated in a semiconductor plastic package due to the difference in the coefficient of thermal expansion between a semiconductor element and a printed wiring board for a semiconductor plastic package, and poor connection may occur between the semiconductor element and the printed wiring board for the semiconductor plastic package, and between the semiconductor plastic package and the printed wiring board implemented therewith. Thus, in order to reduce the warpage to ensure connection reliability, development of a printed wiring board with a small coefficient of thermal expansion in the surface direction is required.

A method for reducing the coefficient of thermal expansion in the surface direction of a laminate for a printed wiring board includes a method of filling a resin composition with an inorganic filler. However, a large filling amount of an inorganic filler has problems of making a resulting resin composition fragile, deteriorating drilling quality for forming a through hole required for interlayer connection of a printed wiring board, and also quickening wear of a drill bit used for machining to significantly decrease productivity of machining. As another method for reducing a coefficient of thermal expansion in the surface direction, it is known to blend an organic filler with rubber elasticity in a varnish containing an epoxy resin (Patent Documents 1-5), and when this varnish is used, a bromine-based flame retardant has sometimes been used for flame retardance of a laminate.

As described above, conventionally, in order to impart flame retardance to a laminate, a formulation using a bromine-based flame retardant in combination has been used. However, in concert with the recently heightened environmental issues, a resin composition using no halogen-based compound has been demanded, and in response to this demand, the use of a phosphorous compound as a substitute for a halogen-based flame retardant has been considered. However, since a phosphorous compound is liable to generate a toxic compound such as phosphine upon combustion, development of a laminate having flame retardance without using a halogen-based compound or a phosphorous compound has been desired.

With the aim of developing a laminate having flame retardance without using a halogen-based compound or a phosphorous compound, a cyanate ester resin has been considered, and a novolac type cyanate ester resin (Patent Document 6) and a naphthol aralkyl type cyanate ester resin are known. However, a phenol novolac type cyanate ester resin, in which a cyanate group equivalent is small, and many unreacted cyanate groups tend to remain upon curing due to its rigid framework structure, is not satisfying in properties such as adhesion to a metal foil, water resistance and heat resistance under moisture absorption. On the other hand, by utilizing a characteristic that the resin framework is a rigid structure, a resin composition comprising a naphthol aralkyl type cyanate ester resin can maintain heat resistance, as well as reducing reaction inhibition factors to enhance curing property, and has a characteristic of being excellent in water resistance and heat resistance under moisture absorption (Patent Document 7).

PRIOR ART DOCUMENTS

Patent Documents

Patent Document 1: JP-B-3173332
Patent Document 2: JP-A-H8-48001
Patent Document 3: JP-A-2000-158589
Patent Document 4: JP-A-2003-246849
Patent Document 5: JP-A-2006-143973
Patent Document 6: JP-A-H11-124433
Patent Document 7: JP-A-2007-45984

SUMMARY OF THE INVENTION

Problem to be Solved by the Invention

Meanwhile, a prepreg for a printed wiring board is generally produced by impregnating a glass cloth with a varnish. This varnish is generally prepared by mixing an inorganic filler and the like to a mixed resin solution of a cyanate ester resin solution, a maleimide compound solution, an epoxy resin solution and the like, and a resin solution of a cyanate ester resin solution, a maleimide compound solution, an epoxy resin solution and the like is required not to precipitate a cyanate ester resin, a maleimide compound, an epoxy resin and the like due to long term storage. A metal foil clad laminate formed by laminating a prepreg produced with a varnish using a solution having precipitation occurred with a metal foil and curing it has a problem of deteriorating properties such as heat resistance under moisture absorption and adhesion to a metal foil. Particularly, when the naphthol aralkyl type cyanate ester resin described above is dissolved in a solvent and stored for a long term at a low temperature, a naphthol aralkyl type cyanate ester resin is precipitated, and a metal foil clad laminate obtained by curing a laminate of a prepreg produced with a varnish having this naphthol aralkyl type cyanate ester resin precipitated and a metal foil has a problem of deteriorating properties such as heat resistance under moisture absorption and adhesion to a metal foil.

Therefore, the object of the invention is to provide a prepreg being excellent in heat resistance under moisture absorption and adhesion to a metal foil even when produced with a varnish using a naphthol aralkyl type cyanate ester resin having been stored for a long term in a solution state, retaining high flame redardance without using a halogen compound or a phosphorous-based compound, and being capable of producing a printed wiring board material with a small coefficient of thermal expansion in the surface direction, and a laminate obtained by curing the same.

Means for Solving the Problem

The inventors have found out that a resin composition comprising a particular cyanate ester, a maleimide compound, silicone rubber powder, and an inorganic filler is excellent in flame retardance even without halogen, and that a laminate with a small coefficient of thermal expansion in the surface direction can be obtained by using the resin composition. In that regard, they discovered that by storing a solution prepared by a method of mixing a maleimide compound to a solvent solution using a naphthol aralkyl type cyanate ester as a particular cyanate ester, a method of mixing a maleimide compound and a solvent after prepolymerizing the naphthol aralkyl type cyanate ester, a method of mixing a maleimide compound after prepolymerizing a solvent solution containing the naphthol aralkyl type cyanate ester, a method of mixing a solvent after prepolymerizing the naphthol aralkyl type cyanate ester and a maleimide compound, a method of prepolymerizing a solvent solution containing the naphthol aralkyl type cyanate ester and a maleimide compound or the like, a prepreg not having precipitation due to long term storage in a solution state and being capable of producing a printed wiring board material retaining excellent heat resistance under moisture absorption and adhesion to a metal foil even when a naphthol aralkyl type cyanate ester solution having been stored for a long term can be obtained, and completed the invention. More specifically, the invention is as follows.

(1) A method for storing a naphthol aralkyl type cyanate ester resin solution (AB), which comprises: preparing (i) a naphthol aralkyl type cyanate ester resin solution (AB) comprising a naphthol aralkyl type cyanate ester resin (A), a maleimide compound (B) and a solvent, (ii) a naphthol aralkyl type cyanate ester resin solution (AB) comprising a prepolymer of a naphthol aralkyl type cyanate ester resin (A), a maleimide compound (B) and a solvent, or (iii) a naphthol aralkyl type cyanate ester resin solution (AB) comprising a prepolymer of a naphthol aralkyl type cyanate ester resin (A) and a maleimide compound (B) and a solvent, and; storing the resin solution (AB).

(2) The storage method, wherein a storage period of the naphthol aralkyl type cyanate ester resin solution (AB) is 1 day to 2 years.

(3) The storage method, wherein the naphthol aralkyl type cyanate ester resin (A) is represented by the following general formula (1):

[Chem. 1]

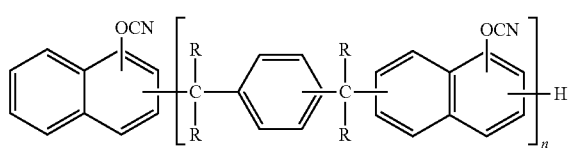

(1)

(wherein Rs independently represent hydrogen atom or methyl group, and n represents an integer of not less than 1).

(4) The storage method, wherein the naphthol aralkyl type cyanate ester resin solution (AB) further comprises a cyanate ester resin (G) other than the naphthol aralkyl type cyanate ester resin (A), a prepolymer of the naphthol aralkyl type cyanate ester resin (A) and a cyanate ester resin (G) other than the naphthol aralkyl type cyanate ester resin (A), or a prepolymer of the naphthol aralkyl type cyanate ester resin (A), the maleimide compound (B) and a cyanate ester resin (G) other than the naphthol aralkyl type cyanate ester resin (A).

(5) A method for producing a prepreg, which comprises: preparing a varnish comprising a naphthol aralkyl type cyanate ester resin solution (AB) stored by the method, a non-halogen epoxy resin (C), silicone rubber powder (D) and an inorganic filler (E), and; impregnating a substrate (F) with the varnish.

(6) The production method for the prepreg, wherein the inorganic filler (E) is a molten silica.

(7) A method for producing a laminate, which comprises heat-molding a prepreg obtained by the production method for the prepreg.

(8) A method for producing a metal foil clad laminate, which comprises curing a laminate of a prepreg obtained by the production method for the prepreg and a metal foil.

Effect of the Invention

The naphthol aralkyl type cyanate ester resin solution (AB) according to the invention hardly precipitates due to long term storage and is stable. A prepreg produced with a varnish using the naphthol aralkyl type cyanate ester resin solution (AB) having been stored for a long term is excellent in heat resistance under moisture absorption. Also, a laminate using the prepreg, which has high flame retardance without using a halogen compound or a phosphorus compound, has a small thermal expansion, and can produce a cured product being excellent in heat resistance under moisture absorption and adhesion to a metal foil, is preferred as a material for a semiconductor plastic package, for which high heat resistance and high reliability are demanded.

MODE FOR CARRYING OUT THE INVENTION

The invention is a method for storing a naphthol aralkyl type cyanate ester resin solution (AB) prepared by a method of adding a solvent and a maleimide compound (B) to a naphthol aralkyl type cyanate ester resin (A), and mixing, a method of adding a maleimide compound to a solvent solution containing a prepolymer of a naphthol aralkyl type cyanate ester resin (A), and mixing, a method of adding a solvent to a prepolymer of a naphthol aralkyl type cyanate ester resin (A) and a maleimide compound (B), and mixing, a method of prepolymerising a solvent solution containing a naphthol aralkyl type cyanate ester resin (A) and a maleimide compound (B), or the like.

The naphthol aralkyl type cyanate ester resin (A) used in the invention is not particularly limited, as long as it is a cyanate esterified naphthol aralkyl resin having naphthol and aralkylene groups mutually coupled. In addition, from the aspects of solvent solubility of a cyanate ester and flame retardance of a laminate, a naphthol aralkyl type cyanate ester resin represented by the above general formula (1) or a prepolymer thereof is preferable. A cyanate ester resin (A) represented by the general formula (1) is obtained by condensing a naphthol aralkyl type cyanate ester resin obtained by reaction of naphthols such as α-naphthol or β-naphthol, with p-xylylene glycol, α,α'-dimethoxy-p-xylene, 1,4-di(2-hydroxy-2-propyl)benzene and the like, with a cyanic acid. The production method is not particularly limited, and any production methods existing as cyanate ester synthesis may be used. Specifically, it can be obtained by reacting a naphthol aralkyl resin represented by the following general formula (2):

[Chem. 2]

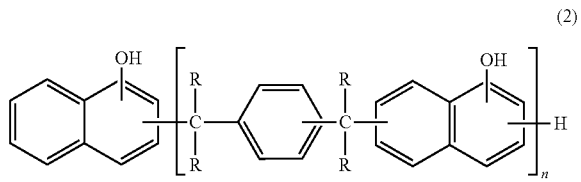

(wherein Rs independently represent hydrogen atom or methyl group, and n represents an integer of not less than 1) and a cyanogen halide in an inert organic solvent in the presence of a basic compound. Moreover, a synthesis method of forming a salt of a similar naphthol aralkyl resin and a basic compound in a solution containing water, and then conducting two phase system interface reaction with a cyanogen halide can be also adopted. In addition, n in the general formula (1) is further preferable to be not more than 10. When n is not more than 10, a resin viscosity does not increase, impregnation to a substrate is good, and performance as a laminate does not decrease. Also, intramolecular polymerization hardly occurs upon synthesis, liquid separation upon water washing improves, and decrease in yield can be prevented.

The maleimide compound (B) used in the invention is not particularly limited, as long as it is a compound having one or more maleimide groups per molecule. Specific examples of the maleimide compound (B) include N-phenyl maleimide, N-hydroxy phenyl maleimide, bis(4-maleimidephenyl)methane, 2,2-bis{4-(4-maleimidephenoxy)-phenyl}propane, bis(3-ethyl-5-methyl-4-maleidephenyl)methane, bis(3,5-dimethyl-4-maleimidephenyl)methane, polyphenyl methane maleimide, prepolymers of these maleimide compounds, prepolymers of a maleimide compound and an amine compound, or the like, and it is also possible to mix one or two kinds or more accordingly to use. More preferable maleimide compounds include bis(4-maleimidephenyl)methane, 2,2-bis{4-(4-maleimidephenoxy)phenyl}propane, and bis(3-ethyl-5-methyl-4-maleimidephenyl)methane.

The additive amount of the above maleimide compound (B) is preferably within a range from 5 to 75% by weight of the total amount of the naphthol aralkyl type cyanate ester resin (A) and the maleimide compound (B). The heat resistance of a resulting laminate may decrease with the additive amount of less than 5% by weight, while the moisture absorption property may decrease with more than 75% by weight. Also, in solutions having the additive amount of the maleimide amount (B) less than 5% by weight and more than 75% by weight of the total amount of the naphthol aralkyl type cyanate ester resin (A) and the maleimide compound (B), precipitation may occur due to long term storage.

In the naphthol aralkyl type cyanate ester resin solution (AB) of the invention, it is also possible to use a cyanate ester resin (G) other than the above naphthol aralkyl type cyanate ester resin (A) in combination to mix or even prepolymerize, within the range that a desired property is not deteriorated. As the cyanate ester resin (G) other than the naphthol aralkyl type cyanate ester resin (A), those that are publicly known can be used. For example, a bisphenol A type cyanate ester resin, a bisphenol F type cyanate ester resin, a bisphenol M type cyanate ester resin, a bisphenol P type cyanate ester resin, a bisphenol E type cyanate ester resin, a phenol novolac type cyanate ester resin, a cresol novolac type cyanate ester resin, a dicyclopentadiene novolac type cyanate ester resin, a tetramethyl bisphenol F type cyanate ester resin, a biphenol type cyanate ester resin and the like, and prepolymers thereof and the like are included, and it is also possible to mix one or two kinds or more accordingly to use. In addition, the above naphthol aralkyl type cyanate ester resin solution (AB) may comprise the cyanate ester resin (G) as it is, may comprise a prepolymer of the naphthol aralkyl type cyanate ester resin (A) and the cyanate ester resin (G), or may comprise a prepolymer of the naphthol aralkyl type cyanate ester resin (A), the maleimide compound (B) and the cyanate ester resin (G).

The method for mixing the naphthol aralkyl type cyanate ester resin (A) and the maleimide compound (B), and the cyanate ester resin (G) if required, is not particularly limited, as long as it is a method for preparing a mixed solution of resins not for the purpose of homopolymerizing or copolymerizing the naphthol aralkyl type cyanate ester resin (A), the maleimide compound (B) and the cyanate ester resin (G), and for example, a method of stirring a mixture containing the naphthol aralkyl type cyanate ester resin (A), the maleimide compound (B) and a solvent while heating, a method of using an ultrasonic washing machine with a heating function and the like are included.

The solvent used in a mixed solution of the naphthol aralkyl type cyanate ester resin (A) and the maleimide compound (B) is not particularly limited, as long as it is compatible with a mixture of the naphthol aralkyl type cyanate ester resin (A), the maleimide compound (B) and the non-halogen epoxy resin (C). Specific examples include ketones such as acetone, methyl ethyl ketone, methyl isobutyl ketone and cyclohexanone, aromatic hydrocarbons such as benzene, toluene and xylene, amides such as dimethylformamide and dimethylacetoamide, and the like.

Also, the prepolymerization method is not particularly limited, as long as it is a method for homopolymerizing or copolymerizing the naphthol aralkyl type cyanate ester resin (A) and the maleimide compound (B), and the cyanate ester resin (G) other than the naphthol aralkyl type cyanate ester resin (A) which is blended if required, and specific examples include a method of dissolving the naphthol aralkyl type cyanate ester resin (A) by heating at a high temperature, and stirring it while heating, a method of heating a solution of the naphthol aralkyl type cyanate ester resin (A) dissolved in a solvent, and refluxing it, a method of heating a solution of the naphthol aralkyl type cyanate ester resin (A) and the maleimide compound (B) dissolved in a solvent, and refluxing it, a method of dissolving the naphthol aralkyl type cyanate ester resin (A), the maleimide compound (B) and the cyanate ester resin (G) by heating at a high temperature, and stirring it while heating, a method of heating a solution of the naphthol aralkyl type cyanate ester resin (A), the maleimide compound (B) and the cyanate ester resin (G) dissolved in a solvent, and refluxing it, and the like, which are not particularly limited, as long as they are methods capable of preparing a solution of a cyanate ester resin and a maleimide compound. In addition, a curing accelerator can also be used so as to adjust the curing speed accordingly. These curing accelerators used include acids such as a mineral acid and a Lewis acid, bases such as sodium alcoholate and tertiary amines, salts such as sodium carbonate, and the like.

The storage conditions for the naphthol aralkyl type cyanate ester resin solution (AB) prepared are not particularly limited, but the temperature is preferably within a range from −20° C. to 40° C., and also it is preferable to store it in a solution with a solid content of 40% by weight to 90% by weight. Moreover, the storage period is not particularly limited, but a range from 1 day to 2 years is preferable.

The invention discloses a prepreg formed by storing the naphthol aralkyl type cyanate ester resin solution (AB), then preparing a varnish blending a non-halogen epoxy resin (C), a silicone rubber powder (D) and an inorganic filler (E) to the resin solution (AB), and impregnating a substrate (F) with the varnish.

The non-halogen epoxy resin (C) used in the invention is not particularly limited, as long as it is a compound having two or more epoxy groups per molecule and not intentionally having any halogen atom within the molecular frame. For example, these non-halogen epoxy resins (C) include a bisphenol A type epoxy resin, a bisphenol F type epoxy resin, a phenol novolac type epoxy resin, a cresol novolac type epoxy resin, a bisphenol A novolac type epoxy resin, a trifunctional phenol type epoxy resin, a tetrafunctional phenol type epoxy resin, a naphthalene type epoxy resin, a biphenyl type epoxy resin, an aralkyl novolac type epoxy resin, a cycloaliphatic epoxy resin, a polyol type epoxy resin, a compound obtained by epoxidizing a double bond of glycidylamine, glycidylester, butadiene or the like, a compound obtained by the reaction of hydroxyl group-containing silicone resins and epichlorohydrin, and so on, and particularly an aralkyl novolac type epoxy resin is preferable in order to improve flame retardance. Here, these aralkyl novolac type epoxy resins can be represented by the following general formula (3), and specifically include a phenol phenyl aralkyl type epoxy resin, a phenol biphenyl aralkyl type epoxy resin, a naphthol aralkyl type epoxy resin and the like. It is possible to use these non-halogen epoxy resins (C) by mixing one or two kinds or more accordingly.

[Chem. 3]

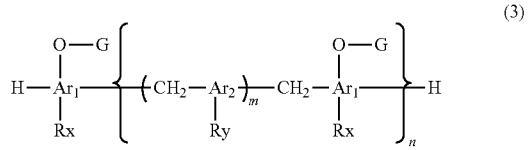

(3)

(In the formula, G represents a glycidyl group, $Ar_1$ represents a quadrivalent aromatic group in which a monocyclic or polycyclic aromatic hydrocarbon becomes a substituent group such as a benzenetetrayl group, a naphthalenetetrayl group and a biphenyltetrayl group, $Ar_2$ represents a trivalent aromatic group in which a monocyclic or polycyclic aromatic hydrocarbon becomes a substituent group such as a benzenetriyl group, a naphthalenetriyl group and a biphenyltriyl group, Rx and Ry independently represent hydrogen atom, an alkyl group, or an aryl group, m represents an integer of 1 to 5, and n represents an integer of 1 to 50.)

The naphthol aralkyl type cyanate ester resin (A) and the non-halogen epoxy resin (C) used in the invention are preferably blended at the ratio (CN/Ep) of the number of cyanate groups (CN) of the naphthol aralkyl type cyanate ester resin (A) and the number of epoxy groups (Ep) of the non-halogen epoxy resin (C) in the resin composition of 0.3 to 2.5. When CN/Ep is less than 0.3, the flame retardance of a laminate may decrease, while when it is more than 2.5, the curing property and the like may decrease.

The silicone rubber powder (D) used in the invention is a fine powder of an addition polymerization product of a vinyl group-containing dimethyl polysiloxane and a methyl hydrogen polysiloxane. Since silicone rubber powder has strong aggregability and tends to have poor dispersibility within a resin composition, it is preferable to use silicone rubber powder having the surface coated with a silicone resin to improve dispersibility. This silicone resin to coat the surface is a polymethyl silsesquioxane having a siloxane bond crosslinked in the form of three-dimensional network. The average particle size (D50) of the silicone rubber powder (D) is not particularly limited, but the average particle size (D50) is preferably 1 to 15 µm in consideration of dispersibility. Here, the average particle size (D50) is a median size, in which when the particle size distribution of the measured powder is divided into two, the amounts of the large side and the small side are equal, and is generally measured by the wet laser diffraction/scattering method. Also, the blending amount of the silicone rubber powder (D) is not particularly limited, but a range from 3 to 30 parts by weight, based on 100 parts by weight of the total blending amount of the naphthol aralkyl type cyanate ester resin (A), the maleimide compound (B) and the non-halogen epoxy resin (C) is preferable, and a range from 3 to 25 parts by weight is particularly preferable. The effect of reducing a thermal expansion in the surface direction may not be sufficiently obtained when the blending amount of the silicone rubber powder (D) is less than this range, while moldability and dispersibility may decrease when it is more than this range.

As the inorganic filler (E) used in the invention, for example, silicas such as natural silica, molten silica, amorphous silica and hollow silica, boehmite, molybdenum compounds such as molybdenum oxide and zinc molybdate, alumina, talc, calcined tare, mica, a glass short fiber, a spherical glass (fine glass powder such as an E-glass, a T-glass and a D-glass) and the like are included. Among them, the molten silica is preferable since it is excellent in low-thermal expansion. It is possible to use these inorganic fillers (E) by mixing one or two kinds or more accordingly. Also, the average particle size (D50) of the inorganic filler (E) is not particularly limited, but the average particle size (D50) is preferably 0.2 to 5 µm in consideration of dispersibility. Moreover, the blending amount of the inorganic filler (E) is preferably within a range from 50 to 150 parts by weight, based on 100 parts by weight of the total blending amount of the naphthol aralkyl type cyanate ester resin (A), the maleimide compound (B) and the non-halogen epoxy resin (C). Furthermore, since moldability may decrease when the blending amount of the inorganic filler (E) is too much, the blending amount of the inorganic filler (E) is particularly preferable to be within a range from 50 to 140 parts by weight.

In association with the above inorganic filler (E), it is also possible to use a silane coupling agent and a wet dispersant in combination. These silane coupling agents are not particularly limited, as long as they are silane coupling agents generally used in surface treatment of inorganic substances. Specific examples include amino silane-based compounds such as γ-aminopropyltriethoxysilane and N-β-(aminoethyl)-γ-aminopropyltrimethoxysilane, epoxy silane-based compounds such as γ-glycidoxypropyltrimethoxysilane, vinyl silane-based compounds such as γ-methacryloxypropyltrimethoxysilane, cationic silane-based compounds such as N-β-(N-vinylbenzylaminoethyl)-γ-aminopropyltrimethoxysilane hydrochloride, phenyl silane-based compounds, and the like, and it is also possible to use them in combination of one or two kinds or more accordingly. Also, the wet dispersant is not particularly limited, as long as it is a dispersion stabilizer used for painting. For example, wet dispersers such as Disperbyk-110, 111, 180, 161, BYK-W996, W9010 and W903 made by BYK-Chemie Japan are included.

In the resin composition of the prepreg used in the invention, it is also possible to use various polymer compounds such as other thermosetting resins, thermoplastic resins, and oligomers and elastomers thereof, other flame retardant compounds, additives, and the like in combination within the range that a desired property is not deteriorated. These are not particularly limited, as long as they are generally used. For example, these flame retardant compounds include nitrogen-containing compounds such as melamine and benzoguanamine, oxazine ring-containing compounds, and the like. Also, these additives include a UV absorber, an antioxidant, a photo polymerization initiator, a fluorescent brightener, a photosensitizer, a dye, a pigment, a thickener, a lubricant, a defoamer, a disperser, a leveling agent, a brightener, a polymerization inhibitor and the like, and it is also possible to use in combination accordingly as desired.

In the resin composition of the prepreg used in the invention, it is also possible to use a curing accelerator in combination, if required, so as to adjust the curing speed accordingly. These curing accelerators are not particularly limited, as long as they are generally used as a curing accelerator for the naphthol aralkyl type cyanate ester resin (A) and the non-halogen epoxy resin (C). Specific examples of these curing accelerators include organic metal salts of copper, zinc, cobalt, nickel or the like, imidazoles and derivatives thereof, tertiary amines, and the like.

As the substrate (F) used in the invention, those used for various printed wiring board materials that are publicly known can be used. For example, glass fibers of an E-glass, a D-glass, an S-glass, an NE-glass, a T-glass or the like, inorganic fibers of those other than glasses, and organic fibers of polyimide, polyamide, polyester or the like are included, and can be selected based on a desired application or performance accordingly. The forms include a woven cloth, a nonwoven cloth, a roving, a chopped strand mat, a surfacing mat, and the like. The thickness is not particularly limited, but those with about 0.01 to 0.30 mm are generally used.

The preparation method for the varnish used in production of the prepreg of the invention is not particularly limited, as long as it is a preparation method of storing the naphthol aralkyl type cyanate ester resin solution (AB) for 1 day to 2 years, and then adding the non-halogen epoxy resin (C), the silicone rubber powder (D), and the inorganic filler (E). The cyanate ester resin (G) may be blended during the preparation of the varnish. In the invention, since the naphthol aralkyl type cyanate ester resin solution (AB) is used in the varnish, the naphthol aralkyl type cyanate ester resin (A), which tends to be precipitated in a single solution, is not precipitated in the varnish. Therefore, a metal foil clad laminate comprising a prepreg produced from this varnish is excellent in heat resistance under moisture absorption and adhesion to a metal foil.

The production method for a prepreg of the invention is not particularly limited, as long as it is a production method of impregnating the substrate (F) with the varnish comprising the naphthol aralkyl type cyanate ester resin solution (AB). For example, a method of impregnating or applying the above varnish to the substrate (F), removing a solvent present if required, and then semi-curing it by heating in a drier at 100 to 200° C. for 1 to 60 minutes or the like to produce a prepreg and the like are included. The adhered amount of the resin composition to the substrate (F) is preferably within a range from 20 to 90% by weight of the resin composition content (including the inorganic filler (E)) in the prepreg.

The production method for a laminate of the invention is, for example, a production method for a laminate obtained by curing a prepreg obtained by the method described in any of the following (1) to (5).

(1) A method for producing a prepreg, which comprises:
  storing a naphthol aralkyl type cyanate ester resin solution (AB) prepared by
    a method of adding a solvent and a maleimide compound (B) to a naphthol aralkyl type cyanate ester resin (A), and mixing,
    a method of adding a solvent to a naphthol aralkyl type cyanate ester resin (A), prepolymerizing the naphthol aralkyl type cyanate ester resin (A), then further adding a maleimide compound (B), and mixing,
    a method of prepolymerizing a naphthol aralkyl type cyanate ester resin (A), then further adding a solvent and a maleimide compound (B), and mixing,
    a method of prepolymerizing a naphthol aralkyl type cyanate ester resin (A) and a maleimide compound (B), then adding a solvent, and mixing,
    a method of adding a solvent and a maleimide compound (B) to a naphthol aralkyl type cyanate ester resin (A), mixing, and prepolymerizing the naphthol aralkyl type cyanate ester resin (A) and the maleimide compound, or the like;
  then preparing a varnish comprising the resin solution (AB), a non-halogen epoxy resin (C), silicone rubber powder (D) and an inorganic filler (E), and;
  impregnating a substrate (F) with the varnish.

(2) A method for producing a prepreg according to the above item (1), wherein the storage period of the naphthol aralkyl type cyanate ester resin solution (AB) is from 1 day to 2 years.

(3) A method for producing a prepreg according to the above item (1), wherein the naphthol aralkyl type cyanate ester resin (A) is represented by the above general formula (1).

(4) A method for producing a prepreg according to the above item (1), wherein the naphthol aralkyl type cyanate ester resin solution (AB) is prepared by
  a method of adding a solvent, a maleimide compound (B) and a cyanate ester resin (G) other than the naphthol aralkyl type cyanate ester resin (A) to the naphthol aralkyl type cyanate ester resin (A), and mixing,
  a method of prepolymerizing the naphthol aralkyl type cyanate ester resin (A), then further adding a solvent, a maleimide compound (B) and a cyanate ester resin (G) other than the naphthol aralkyl type cyanate ester resin (A), and mixing,
  a method of adding a solvent to the naphthol aralkyl type cyanate ester resin (A), prepolymerizing the naphthol aralkyl type cyanate ester resin (A), then adding a maleimide compound (B) and a cyanate ester resin (G) other than the naphthol aralkyl type cyanate ester resin (A), and mixing,
  a method of adding a maleimide compound (B) to the naphthol aralkyl type cyanate ester resin (A), mixing, prepolymerizing the naphthol aralkyl type cyanate ester resin (A) and the maleimide compound (B), then further adding a solvent and a cyanate ester resin (G) other than the naphthol aralkyl type cyanate ester resin (A), and mixing,
  a method of adding a solvent and a maleimide compound (B) to the naphthol aralkyl type cyanate ester resin (A), mixing, prepolymerizing the naphthol aralkyl type cyanate ester resin (A) and the maleimide compound (B), then further adding a cyanate ester resin (G) other than the naphthol aralkyl type cyanate ester resin (A), and mixing, a method of adding a cyanate ester resin (G) other than the naphthol aralkyl type cyanate ester resin (A) to the naphthol aralkyl type cyanate ester resin (A), mixing, prepolymerizing the naphthol aralkyl type cyanate ester resin (A) and the cyanate ester resin (G) other than the naphthol aralkyl type cyanate ester resin (A), then further adding a solvent and a maleimide compound (B), and mixing, a method of adding a solvent and a cyanate ester resin (G) other than the naphthol aralkyl type cyanate ester resin (A) to the naphthol aralkyl type cyanate ester resin (A), mixing, prepolymerizing the naphthol aralkyl type cyanate ester resin (A) and the cyanate ester resin (G) other than the naphthol aralkyl type cyanate ester resin (A), then further adding a maleimide compound (B), and mixing, a method of adding a maleimide compound (B) and a cyanate ester resin (G) other than the naphthol aralkyl type cyanate ester resin (A) to the naphthol aralkyl type cyanate ester resin (A), mixing, prepolymerizing the naphthol aralkyl type cyanate ester resin (A), the maleimide compound (B) and the cyanate ester resin (G) other than the naphthol aralkyl type cyanate ester resin (A), then adding a solvent, and mixing, a method of adding a solvent, a maleimide compound (B) and a cyanate ester resin (G) other than the naphthol aralkyl type cyanate ester resin (A) to the naphthol aralkyl type cyanate ester resin (A), mixing, and prepolymerizing the naphthol aralkyl type cyanate ester resin (A), the maleimide compound (B) and the cyanate ester resin (G) other than the naphthol aralkyl type cyanate ester resin (A), or the like.

(5) A method for producing a prepreg according to the above item (1), wherein the inorganic filler (E) is a molten silica.

Specifically, it is produced by laminating and forming the structure of one or a superimposed plurality of the prepreg described above with a metal foil of copper, aluminum or the like disposed on one side or both sides, as desired. These metal foils used are not particularly limited, as long as they are those used for printed wiring board materials, and include a copper foil and the like, for example. As laminating and forming conditions, a method for a normal laminate and multilayer board for a printed wiring board and can be applied. For example, a multi-daylight press, a multi-daylight vacuum press, a continuous forming machine, an autoclave forming machine and the like are used, and typical ranges of temperature is 100 to 300° C., pressure is 2 to 100 kgf/cm², and heating time is 0.05 to 5 hours. In addition, post-curing may be conducted at a temperature of 150 to 300° C. if required.

EXAMPLES

Although Synthesis Examples, Examples and Comparative Examples are shown below to describe the invention in detail, the invention is not limited thereto.

Synthesis Example 1

Synthesis of α-Naphthol Aralkyl Type Cyanate Ester Resin-1

103 g (OH group: 0.47 mole) of an α-naphthol aralkyl resin (SN485, OH group equivalent: 219 g/eq., softening point: 86° C., made by Nippon Steel Chemical) represented by the following formula (4):

[Chem. 4]

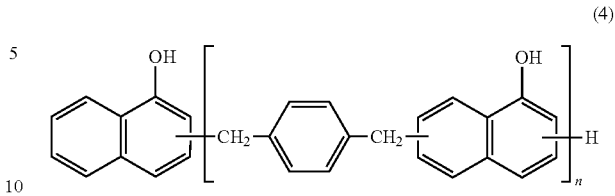

(4)

was dissolved in 500 ml of chloroform, then 0.7 mole of triethylamine was added and mixed, which was added dropwise to 0.93 mole of cyan chloride in 300 g of chloroform solution at −10° C. for 1.5 hours and stirred for 30 minutes, and a mixed solution of 0.1 mole of triethylamine and 30 g of chloroform was further added dropwise and stirred for 30 minutes to complete the reaction. A hydrochloride salt of triethylamine produced was filtered and separated, the obtained filtrate was washed with 500 ml of 0.1 N hydrochloric acid and then washed with 500 ml of water four times. Then, a chloroform phase of the chloroform/water mixed solution was extracted by separation treatment, and dehydration treatment was conducted by adding sodium sulfate to the chloroform solution. After filtering and separating sodium sulfate, by evaporating at 75° C. and further deaerating under vacuum at 90° C., an α-naphthol aralkyl type cyanate ester resin represented by the following formula (5):

[Chem. 5]

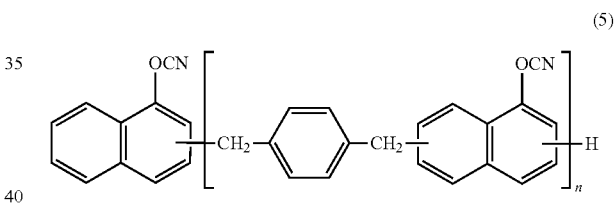

(5)

as a brown solid was obtained. In the infrared spectrum, absorption of cyanate ester groups in the proximity of 2264 cm$^{-1}$ was confirmed. Moreover, as the structure was identified by $^{13}$C-NMR and $^{1}$H-NMR, the conversion from OH groups to OCN groups was not less than 99%. Furthermore, by differential refractive index detection in GPC, the percentage of compounds with n of 1 to 4 was 93% by weight.

Synthesis Example 2

Synthesis of α-Naphthol Aralkyl Type Cyanate Ester Resin-2

An α-naphthol aralkyl type cyanate ester resin represented by the above formula (5) was synthesized by the same method as Synthesis Example 1, except that 102 g (OH group: 0.45 mole) of an α-naphthol aralkyl resin (SN4105, OH group equivalent: 226 g/eq., softening point: 105° C., made by Nippon Steel Chemical) was used as a substitute for the α-naphthol aralkyl resin (SN485, OH group equivalent: 219 g/eq., softening point: 86° C., made by Nippon Steel Chemical) and that the used amount of cyan chloride was 0.90 mole. In the infrared spectrum, absorption of cyanate ester groups in the proximity of 2264 cm$^{-1}$ was confirmed. Moreover, as the structure was identified by $^{13}$C-NMR and $^{1}$H-NMR, the conversion from OH groups to OCN groups was not less than 99%. Furthermore, by differential refractive index detection in GPC, the percentage of compounds with n of 1 to 4 was 75% by weight.

Synthesis Example 3

Prepolymerization of Naphthol Aralkyl Type Cyanate Ester Resin and Maleimide Compound A mixed solution (prepolymerized solution) of a naphthol aralkyl type cyanate ester resin and a maleimide compound was obtained by melting 60 parts by weight of the α-naphthol aralkyl type cyanate ester (cyanate equivalent: 237 g/eq.) prepared in Synthesis Example 1 and 40 parts by weight of bis(3-ethyl-5-methyl-4-maleimidepheyl)methane (BMI-70, made by KI Chemical Industry) by heating at 160° C., reacting it for 6 hours with stirring, adding 80 parts by weight of methyl ethyl ketone after cooling, and stirring it for 1 hour.

Comparative Synthesis Example 1

Prepolymerization of α-Naphthol Aralkyl Type Cyanate Ester Resin

A prepolymer solution of an α-naphthol aralkyl type cyanate ester resin was obtained by heating a solution having 20 parts by weight of methyl ethyl ketone added to 50 parts by weight of the α-naphthol aralkyl type cyanate ester resin prepared in Synthesis Example 1 for 30 hours, and conducting reflux treatment.

Example 1

A uniform mixed solution was prepared by adding 50 parts by weight of methyl ethyl ketone to 50 parts by weight of the α-naphthol aralkyl type cyanate ester (cyanate equivalent: 237 g/eq.) prepared in Synthesis Example 1 and 20 parts by weight of bis(3-ethyl-5-methyl-4-maleimidepheyl)methane (BMI-70, made by KI Chemical Industry), and stirring it at 60° C. for 1 hour. A varnish was obtained by leaving the above mixed solution at room temperature for 1 month, and further adding 30 parts by weight of a phenol biphenyl aralkyl type epoxy resin (NC-3000-FH, epoxy equivalent: 320 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Example 2

A prepreg was obtained as same as Example 1, except that the storage period of the uniform mixed solution was changed from 1 month to 6 months in Example 1.

Example 3

A prepreg was obtained as same as Example 1, except that the storage period of the uniform mixed solution was changed from 1 month to 12 months in Example 1.

Example 4

A prepreg was obtained as same as Example 1, except that 50 parts by weight of the α-naphthol aralkyl type cyanate ester (cyanate equivalent: 237 g/eq.) prepared in Synthesis Example 1 was substituted with 50 parts by weight of the α-naphthol aralkyl type cyanate ester resin (cyanate equivalent: 244 g/eq.) obtained in Synthesis Example 2 in Example 1.

Example 5

A uniform mixed solution was prepared by adding 52 parts by weight of methyl ethyl ketone to 52 parts by weight of the α-naphthol aralkyl type cyanate ester (cyanate equivalent: 237 g/eq.) prepared in Synthesis Example 1 and 20 parts by weight of bis(3-ethyl-5-methyl-4-maleimidepheyl)methane (BMI-70, made by KI Chemical Industry), and stirring it at 60° C. for 1 hour. A varnish was obtained by leaving the above mixed solution at room temperature for 1 month, and further adding 28 parts by weight of a phenol biphenyl aralkyl type epoxy resin (NC-3000-H, epoxy equivalent: 290 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Example 6

A uniform mixed solution was prepared by adding 55 parts by weight of methyl ethyl ketone to 55 parts by weight of the α-naphthol aralkyl type cyanate ester (cyanate equivalent: 237 g/eq.) prepared in Synthesis Example 1 and 20 parts by weight of bis(3-ethyl-5-methyl-4-maleimidepheyl)methane (BMI-70, made by KI Chemical Industry), and stirring it at 60° C. for 1 hour. A varnish was obtained by leaving the above mixed solution at room temperature for 1 month, and further adding 25 parts by weight of a phenol phenyl aralkyl type epoxy resin (xyloc type epoxy resin, epoxy equivalent: 240 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Example 7

A uniform mixed solution was prepared by adding 40 parts by weight of methyl ethyl ketone to 40 parts by weight of the α-naphthol aralkyl type cyanate ester (cyanate equivalent: 237 g/eq.) prepared in Synthesis Example 1 and 20 parts by weight of a prepolymer of bis(3-ethyl-5-methyl-4-maleimidepheyl)methane (BMI-70, made by KI Chemical Industry) prepared in Synthesis Example 3 and the α-naphthol aralkyl type cyanate ester, and stirring it at 60° C. for 1 hour. A varnish was obtained by leaving the above mixed solution at room temperature for 1 month, and further adding 30 parts by weight of a phenol biphenyl aralkyl type epoxy resin (NC-3000-FH, epoxy equivalent: 320 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Comparative Example 1

A uniform mixed solution was prepared by adding 50 parts by weight of methyl ethyl ketone to 50 parts by weight of the α-naphthol aralkyl type cyanate ester (cyanate equivalent: 237 g/eq.) prepared in Synthesis Example 1, and stirring it at 60° C. for 1 hour. Separately, a uniform mixed solution was prepared by adding 20 parts by weight of methyl ethyl ketone to 20 parts by weight of bis(3-ethyl-5-methyl-4-maleimidepheyl)methane (BMI-70, made by KI Chemical Industry), and stirring it at 60° C. for 1 hour. These cyanate resin solution and malaimide compound solution were left at room temperature for 1 month separately. Then, a varnish was obtained by mixing the cyanate resin solution, the malaimide compound solution, 30 parts by weight of a phenol biphenyl aralkyl type epoxy resin (NC-3000-FH, epoxy equivalent: 320 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Comparative Example 2

A uniform mixed solution was prepared by adding 50 parts by weight of methyl ethyl ketone to 50 parts by weight of the α-naphthol aralkyl type cyanate ester (cyanate equivalent: 237 g/eq.) prepared in Synthesis Example 2, and stirring it at 60° C. for 1 hour. Separately, a uniform mixed solution was prepared by adding 20 parts by weight of methyl ethyl ketone to 20 parts by weight of bis(3-ethyl-5-methyl-4-maleimidepheyl)methane (BMI-70, made by KI Chemical Industry), and stirring it at 60° C. for 1 hour. These cyanate resin solution and malaimide compound solution were left at room temperature for 1 month separately. Then, a varnish was obtained by mixing the cyanate resin solution, the malaimide compound solution, 30 parts by weight of a phenol biphenyl aralkyl type epoxy resin (NC-3000-FH, epoxy equivalent: 320 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Comparative Example 3

A uniform mixed solution was prepared by adding 20 parts by weight of methyl ethyl ketone to 20 parts by weight of bis(3-ethyl-5-methyl-4-maleimidepheyl)methane (BMI-70, made by KI Chemical Industry), and stirring it at 60° C. for 1 hour. The prepolymer solution of α-naphthol aralkyl type cyanate ester prepared in Comparative Synthesis Example 1 and the malaimide compound solution were left at room temperature for 1 month separately. Then, a varnish was obtained by mixing the cyanate resin solution, the malaimide compound solution, 30 parts by weight of a phenol biphenyl aralkyl type epoxy resin (NC-3000-FH, epoxy equivalent: 320 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Comparative Example 4

A uniform mixed solution was prepared by adding 40 parts by weight of methyl ethyl ketone to 40 parts by weight of the α-naphthol aralkyl type cyanate ester (cyanate equivalent: 237 g/eq.) prepared in Synthesis Example 1 and 8 parts by weight of 2,2-bis(4-cyanatephenyl)propane, and stirring it at 60° C. for 1 hour. Separately, a uniform mixed solution was prepared by adding 12 parts by weight of methyl ethyl ketone to 12 parts by weight of bis(3-ethyl-5-methyl-4-maleimidepheyl)methane (BMI-70, made by KI Chemical Industry), and stirring it at 60° C. for 1 hour. A varnish was obtained by leaving the above mixed solutions at room temperature for 1 month, and mixing 30 parts by weight of a phenol biphenyl aralkyl type epoxy resin (NC-3000-FH, epoxy equivalent: 320 g/eq., made by Nippon Kayaku), 2 parts by weight of a wet disperser (disperbyk-161, made by BYK-Chemie Japan), 90 parts by weight of spherical molten silica (SC2050MOB, made by Admatechs), 20 parts by weight of silicone rubber powder (KMP-600, made by Shin-Etsu Chemical) having the surface coated with a silicone resin to improve dispersibility, and 0.02 parts by weight of zinc octoate. This varnish was diluted with methyl ethyl ketone, impregnated and coated to an E-glass woven cloth with a thickness of 0.1 mm, and dried at 160° C. for 4 minutes to obtain a prepreg with a resin content of 50% by weight.

Comparative Example 5

A prepreg was obtained as same as Example 1, except that 20 parts by weight of silicone rubber powder (KMP-600, made by Shin-Etsu Chemical) having the surface coated with a silicone resin to improve dispersibility was excluded in Example 1.

Comparative Example 6

A prepreg was obtained as same as Example 1, except that 50 parts by weight of a prepolymer of 2,2-bis(4-cyanatephenyl)propane (BT2070, cyanate equivalent: 139 g/eq., made by Mitsubishi Gas Chemical) was used as a substitute for 50 parts by weight of the α-naphthol aralkyl type cyanate ester (cyanate equivalent: 237 g/eq.) prepared in Synthesis Example 1 in Example 1.

Comparative Example 7

A prepreg was obtained as same as Example 1, except that a mixed solution prepared by adding 50 parts by weight of methyl ethyl ketone to 70 parts by weight of the α-naphthol aralkyl type cyanate ester (cyanate equivalent: 237 g/eq.) prepared in Synthesis Example 1 and stirring at 60° C. for 1 hour was used as a substitute for the uniform mixed solution prepared by adding 50 parts by weight of methyl ethyl ketone to 50 parts by weight of 50 parts by weight of the α-naphthol aralkyl type cyanate ester (cyanate equivalent: 237 g/eq.) prepared in Synthesis Example 1 and 20 parts by weight of bis(3-ethyl-5-methyl-4-maleimidepheyl)methane (BMI-70, made by KI Chemical Industry) and stirring at 60° C. for 1 hour in Example 1.

<Production of Metal Foil Clad Laminate>

4 prepregs obtained in each of Examples 1 to 7 and Comparative Examples 1 to 7 were superimposed, electrolyte copper foils (3EC-III, made by Mitsui Mining & Smelting) with a thickness of 12 μm were disposed on top and bottom thereof, and laminating and forming at a pressure of 30 kgf/cm$^2$ and a temperature of 220° C. was conducted for 120 minutes to obtain a copper clad laminate with an insulating layer thickness of 0.38 to 0.45 mm.

The evaluation results of storage stability using the solutions of α-naphthol aralkyl type cyanate ester and bis(3-ethyl-5-methyl-4-maleimidepheyl)methane are shown in Table 1.

In the storage stability test, precipitation of samples of the mixed solutions of α-naphthol aralkyl type cyanate ester and bis(3-ethyl-5-methyl-4-maleimidepheyl)methane having been left at room temperature was visually evaluated, and those with no precipitation observed were denoted as ○ and those where precipitation occurred were denoted as ×.

The evaluation results of flame retardance, coefficient of thermal expansion, copper foil peel strength and heat resistance under moisture absorption using the obtained metal foil clad laminates are shown in Table 2.

The evaluation of flame retardance and the measurements of coefficient of thermal expansion were conducted by the following method, after etching the metal foil clad laminates to remove copper foils.

Combustion Test: It was evaluated based on the UL94 vertical combustion test.

Coefficient of Thermal Expansion: The linear expansion coefficient in the surface direction at 60° C. to 120° C. was measured with a thermomechanical analysis instrument (made by TA Instruments) by increasing the temperature at 10° C. per minute from 40° C. to 340° C. For the measurement direction, it was measured in both directions of the warp thread (Y) direction and the weft thread direction (X) of the glass cloth.

The copper foil peel strength was measured based on JIS C6481, the heat resistance under moisture absorption was evaluated by visually observing change in appearance of a sample piece having the entire copper foil other than the half in one side of a 50 mm×50 mm sample removed by etching, after being treated in a pressure cooker testing machine (PC-3 model) at 121° C. and 2 atmospheric pressure and immersed in solder at 260° C. for 30 seconds, and the evaluation results are shown in (number of blisters generated/number of tests).

TABLE 1

|  | Example 1 | Example 2 | Example 3 | Example 4 | Example 5 | Example 6 | Example 7 |
|---|---|---|---|---|---|---|---|
| Storage stability | ○ | ○ | ○ | ○ | ○ | ○ | ○ |

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Storage stability | X | X | X | X | ○ | X | X |

TABLE 2

|  | Example 1 | Example 2 | Example 3 | Example 4 | Example 5 | Example 6 | Example 7 |
|---|---|---|---|---|---|---|---|
| Flame retardance | V-0 | V-0 | V-0 | V-0 | V-0 | V-0 | V-0 |
| Coefficient of thermal expansion in Y direction | 10.8 | 10.9 | 10.7 | 10.6 | 10.5 | 10.4 | 10.4 |
| Coefficient of thermal expansion in X direction | 11.2 | 11 | 11.1 | 11.1 | 10.8 | 10.9 | 11.2 |
| Copper foil peel strength | 1 | 1 | 1 | 1 | 1 | 1 | 1 |
| Heat resistance under moisture absorption | 0/4 | 0/4 | 0/4 | 0/4 | 0/4 | 0/4 | 0/4 |

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Flame retardance | V-0 | V-0 | V-0 | V-0 | V-0 | V-1 | V-1 |
| Coefficient of thermal expansion in Y direction | 10.4 | 10.6 | 10.5 | 10.4 | 12.3 | 10.8 | 10.8 |

TABLE 2-continued

| Coefficient of thermal expansion in X direction | 10.9 | 11 | 11.1 | 10.7 | 12.7 | 11.4 | 11.1 |
|---|---|---|---|---|---|---|---|
| Copper foil peel strength | 0.8 | 0.8 | 0.8 | 0.8 | 1 | 0.9 | 1 |
| Heat resistance under moisture absorption | 4/4 | 4/4 | 4/4 | 4/4 | 0/4 | 4/4 | 4/4 |

Unit:
Coefficient of thermal expansion: ppm/° C.
Copper foil peel strength: kgf/cm The results show that Examples 1 to 7 using the mixed resin solution (AB) prepared by the method of mixing or the method prepolymerizing the α-naphthol aralkyl type cyanate ester resin (A) and the maleimide compound (B) had excellent heat resistance under moisture absorption and high copper foil peel intensity, as compared to Comparative Examples 1 to 4 and 6, in which the vanish was prepared without using the mixed resin solution (AB) of the cyanate ester resin (A) and the maleimide compound (B). Also, Comparative Example 5, which did not use silicone rubber powder having the surface coated with a silicone resin to improve dispersibility, had a high coefficient of thermal expansion, as compared to Example 1. Moreover, Comparative Example 6, which did not use the α-naphthol aralkyl type cyanate ester resin, had poor flame retardance, as compared to Example 1.

The invention claimed is:

1. A method for storing a naphthol aralkyl type cyanate ester resin solution (AB), which comprises:
   preparing
      (i) a naphthol aralkyl type cyanate ester resin solution (AB) comprising:
         (i-1) a naphthol aralkyl type cyanate ester resin (A),
         (i-2) a maleimide compound (B), and
         (i-3) a solvent,
      (ii) a naphthol aralkyl type cyanate ester resin solution (AB) comprising:
         (ii-1) a prepolymer of a naphthol aralkyl type cyanate ester resin (A),
         (ii-2) a maleimide compound (B), and
         (ii-3) a solvent, or
      (iii) a naphthol aralkyl type cyanate ester resin solution (AB) comprising:
         (iii-1) a prepolymer of a naphthol aralkyl type cyanate ester resin (A) and
         (iii-2) a maleimide compound (B), and a solvent, and
   storing the resin solution (AB) at a temperature of −20° C. to 40° C. for 1 day to 2 years, wherein the resin solution (AB) has a solid content of 40% by weight to 90% by weight.

2. A method for storing a naphthol aralkyl type cyanate ester resin solution (AB) according to claim 1, wherein the naphthol aralkyl type cyanate ester resin (A) is represented by the following formula (1):

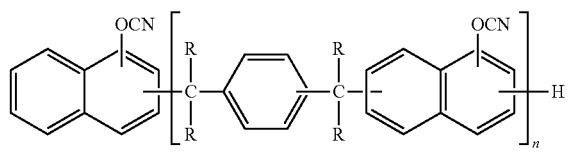

wherein Rs independently represent a hydrogen atom or a methyl group, and n represents an integer of not less than 1.

3. A method for storing a naphthol aralkyl type cyanate ester resin solution (AB) according to claim 1, wherein the naphthol aralkyl type cyanate ester resin solution (AB) further comprises:
   a cyanate ester resin (G) other than the naphthol aralkyl type cyanate ester resin (A);
   a prepolymer of the naphthol aralkyl type cyanate ester resin (A) and a cyanate ester resin (G) other than the naphthol aralkyl type cyanate ester resin (A); or
   a prepolymer of the naphthol aralkyl type cyanate ester resin (A), the maleimide compound (B) and a cyanate ester resin (G) other than the naphthol aralkyl type cyanate ester resin (A).

* * * * *